(12) United States Patent
Lu

(10) Patent No.: US 11,553,623 B2
(45) Date of Patent: Jan. 10, 2023

(54) CONNECTOR ASSEMBLY WITH HEAT SINK AND CLIP

(71) Applicant: Molex, LLC, Lisle, IL (US)

(72) Inventor: You-Qian Lu, New Taipei (TW)

(73) Assignee: Molex, LLC, Lisle, IL (US)

( * ) Notice: Subject to any disclaimer, the term of this patent is extended or adjusted under 35 U.S.C. 154(b) by 113 days.

(21) Appl. No.: 17/211,882

(22) Filed: Mar. 25, 2021

(65) Prior Publication Data
US 2021/0307204 A1 Sep. 30, 2021

(30) Foreign Application Priority Data

Mar. 30, 2020 (CN) .......................... 202010234837.8

(51) Int. Cl.
| | |
|---|---|
| *H05K 7/20* | (2006.01) |
| *H01R 13/6594* | (2011.01) |
| *F16B 2/20* | (2006.01) |
| *H01R 13/6584* | (2011.01) |
| *H01R 13/502* | (2006.01) |
| *H05K 9/00* | (2006.01) |
| *H01R 13/6581* | (2011.01) |

(52) U.S. Cl.
CPC .......... *H05K 7/20418* (2013.01); *F16B 2/20* (2013.01); *H01R 13/6584* (2013.01); *H01R 13/6594* (2013.01); *H05K 7/20436* (2013.01); *H01R 13/502* (2013.01); *H01R 13/6581* (2013.01); *H05K 7/20* (2013.01); *H05K 7/20409* (2013.01); *H05K 9/0018* (2013.01)

(58) Field of Classification Search
CPC .......... H05K 7/20418; H05K 7/20436; H05K 7/20409; H05K 9/0018; H05K 7/20; F16B 2/20; H01R 13/6584; H01R 13/6594; H01R 13/6581; H01R 13/502
See application file for complete search history.

(56) References Cited

U.S. PATENT DOCUMENTS

| | | | |
|---|---|---|---|
| 6,816,376 B2 | 11/2004 | Bright et al. | |
| 8,382,509 B2 | 2/2013 | David et al. | |
| 2007/0183128 A1* | 8/2007 | Pirillis | H05K 9/0058 361/715 |
| 2018/0337476 A1 | 11/2018 | Guy Ritter et al. | |

FOREIGN PATENT DOCUMENTS

| | | |
|---|---|---|
| CN | 104409913 A | 3/2015 |
| TW | M468059 U | 12/2013 |
| WO | 03077376 A1 | 9/2003 |

* cited by examiner

*Primary Examiner* — Abdullah A Riyami
*Assistant Examiner* — Justin M Kratt

(57) ABSTRACT

A connector assembly includes a receptacle connector, a shielding cage, a heat sink and a clip. The shielding cage covers the receptacle connector. The clip assembles the heat sink to the shielding cage, is integrally formed by a metal sheet and includes a fixed plate, a movable plate and a plate spring. The fixed plate is provided to the shielding cage, and the movable plate is provided to a side surface of the heat sink. Two ends of the plate spring are respectively connected to the fixed plate and the movable plate, and the movable plate is capable of moving relative to the fixed plate by means of the plate spring.

8 Claims, 8 Drawing Sheets

CONNECTOR ASSEMBLY WITH HEAT SINK AND CLIP

RELATED APPLICATION

The present application claims priority to Chinese Patent Application No. 202010234837.8 filed Mar. 30, 2020 which is incorporated by reference herein in its entirety.

TECHNICAL FIELD

The present disclosure relates to a connector assembly, and particularly relates to a connector assembly which has a shielding cage, a heat sink and a clip.

BACKGROUND

Chinese invention patent application issuance publication No. CN1314307C (corresponding to U.S. Pat. No. 6,816,376) discloses a receptacle having a heat sink, the receptacle includes a clip used to assemble the heat sink, the clip is provided with a downward pressing elastic arm which extends along a left-right direction and spans fins of the heat sink, the heat sink can be assembled in a manner of pressing downwardly and fixing by the downward pressing elastic arm. However, in such a fixing manner, in order to generate a plane for the downward pressing elastic arm of the clip, it is necessary to remove some heat dissipating fins of the heat sink corresponding to the downward pressing elastic arm, thereby lowering heat dissipating capability of the heat sink. Moreover, the downward pressure provided to the heat sink by the clip is realized by the bending and forming the downward pressing elastic arm to control relative height, so the dimensional tolerance of the height requires a large range. In order to reduce the dimensional tolerance to meet the functional requirement, better material needs to be selected, the corresponding mold size and mold strength should be also increased, and the maintenance of the mold during mass production also needs to be increased, thereby resulting in significant increase in the whole cost.

Chinese utility model patent application issuance publication No. CN202308382U (corresponding to U.S. Pat. No. 8,382,509) discloses an electrical connector system and a spring clip thereof used to fix a heat sink, spring arms of the spring clip are positioned at side surfaces of a cage of the electrical connector system and an extension direction of the spring arm is perpendicular to a movement direction of the heat sink, in such a structure, the heat sink necessarily has a notch on a side surface to receive the spring arm, thereby increasing a dimension of the electrical connector system in a lateral direction, and, the notch and the spring arm necessarily extend toward a special direction, so there is no flexibility in design. Moreover, in such a configuration, free ends of the spring arms support the heat sink and the spring arms provide single cantilever support; however, the supporting force and the spring force provided to the heat sink in such a design are insufficient.

SUMMARY

Therefore, an object of the present disclosure is to provide a connector assembly which can improve at least one of deficiencies in prior art.

Accordingly, in some embodiments, a connector assembly of the present disclosure comprises a receptacle connector, a shielding cage, a heat sink and a clip. The shielding cage covers the receptacle connector. The clip assembles the heat sink to the shielding cage, the clip is integrally formed by a metal sheet and comprises a fixed plate, a movable plate and a plate spring, the fixed plate is provided to the shielding cage, the movable plate is provided to a side surface of the heat sink, two ends of the plate spring are respectively connected to the fixed plate and the movable plate, the movable plate is capable of moving relative to the fixed plate by means of the plate spring.

In some embodiments, the clip integrally comprises two fixed plates and two movable plates, each movable plate and one corresponding fixed plate are connected by the plate spring, the two fixed plates are respectively provided to two side surfaces of the shielding cage, the two movable plates are respectively provided to two side surfaces of the heat sink.

In some embodiments, the movable plate has a heat sink connection portion and a plate spring connection portion, the fixed plate is formed with an opening, the plate spring connection portion extends into the opening, the plate spring is positioned in the opening, and the two ends of the plate spring are respectively connected to the plate spring connection portion of the movable plate and an inner edge of the opening of the fixed plate.

In some embodiments, each movable plate has two plate spring connection portions integrally extending from two ends of the heat sink connection portion, the two plate spring connection portions each are connected to one the plate spring.

In some embodiments, the plate spring is configured by blanking the fixed plate, and the plate spring is a plate shaped into a continuous S shape.

In some embodiments, the shielding cage has a top wall which is formed with a window, the heat sink comprises a heat dissipating base plate and a thermal coupling plate which is provided to a bottom surface of the heat dissipating base plate and positioned at a bottom of the heat sink, the thermal coupling plate enters into the shielding cage via the window of the top wall of the shielding cage, the clip further comprises a frame plate which is positioned between the top wall of the shielding cage and the heat dissipating base plate of the heat sink and is positioned around the window of the top wall.

In some embodiments, the clip comprises two fixed plates, the two fixed plates are respectively provided to two side surfaces of the shielding cage, the frame plate has a front frame and a rear frame which are connected between the two fixed plates and side frames which extend respectively from the two fixed plate.

In some embodiments, the heat sink comprises a plurality of heat dissipating fin plates which are arranged side by side in a left-right direction and each continuously extend in a front-rear direction, the two movable plates of the clip are provided to outer side surfaces of the two heat dissipating fin plates which positioned at a left side and a right side of the plurality of heat dissipating fin plates.

The clip of the connector assembly of the present disclosure is provided to the heat sink from the left side and the right side of the heat sink, it is not necessary for the design to remove the structure at the middle of the heat sink (for example heat dissipating fin plate), it can maximally remain the structure at the middle of the heat sink (the heat dissipating fin plate), so as to increase heat dissipating area and provide better heat dissipating capability. In addition, the plate spring of the clip is configured by blanking the fixed plate, so the mold design is simpler, dimensional tolerance to be controlled is smaller, and mold dimensional requirement, mold strength requirement and mass production and maintain requirement are also smaller, whole manufacturing cost is lower. The frame plate of the clip can block a gap generated between the shielding cage and the heat sink when the heat sink is raised, thereby increasing shielding effect.

BRIEF DESCRIPTION OF THE DRAWINGS

Other features and effects of the present disclosure will be apparent from an embodiment illustrated in the drawings, in which.

DETAILED DESCRIPTION OF THE PREFERRED EMBODIMENTS

Figure 1:
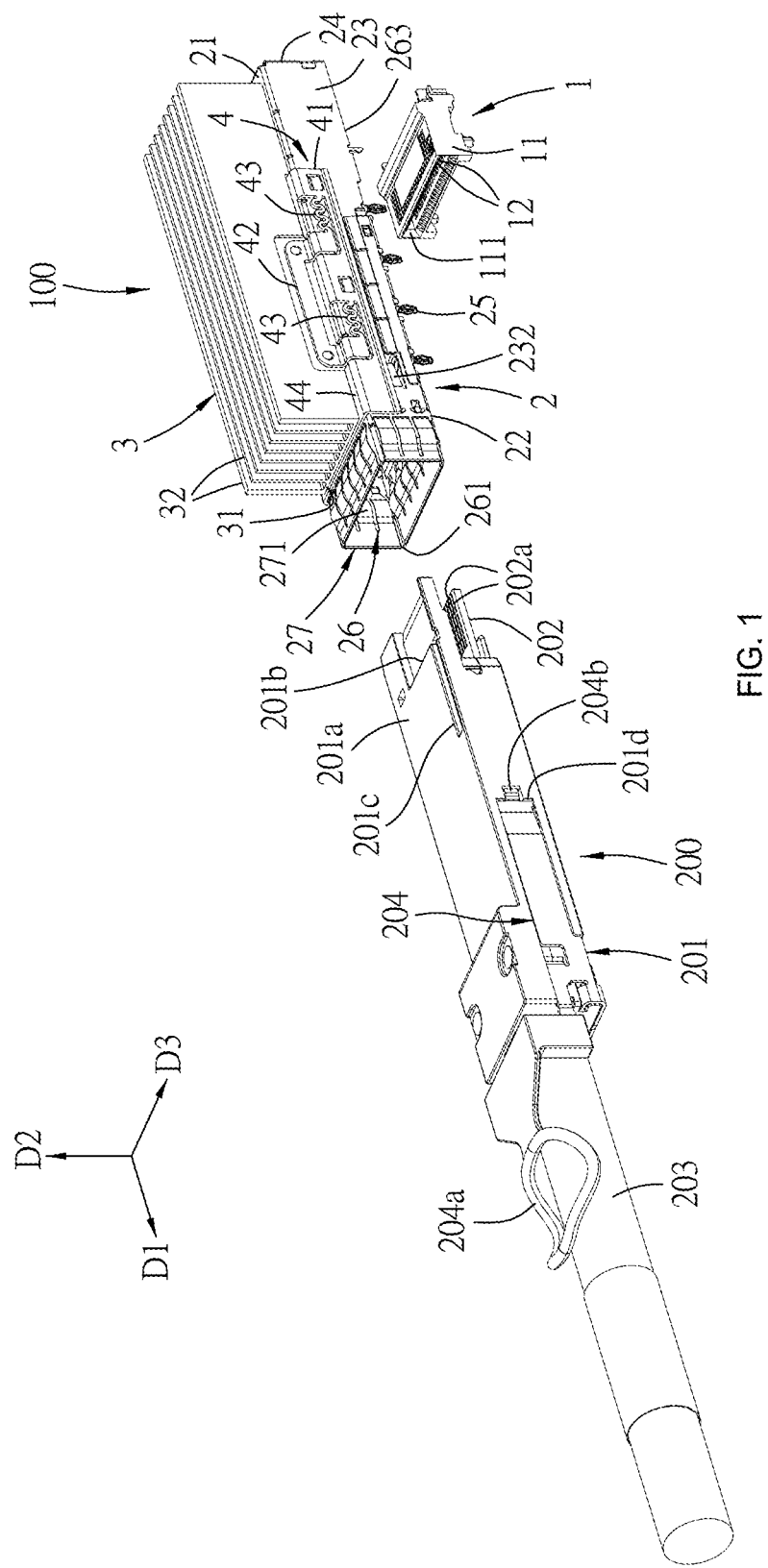
FIG. 1 is a perspective exploded view of an embodiment of a connector assembly of the present disclosure and a pluggable module.
Figure 2:
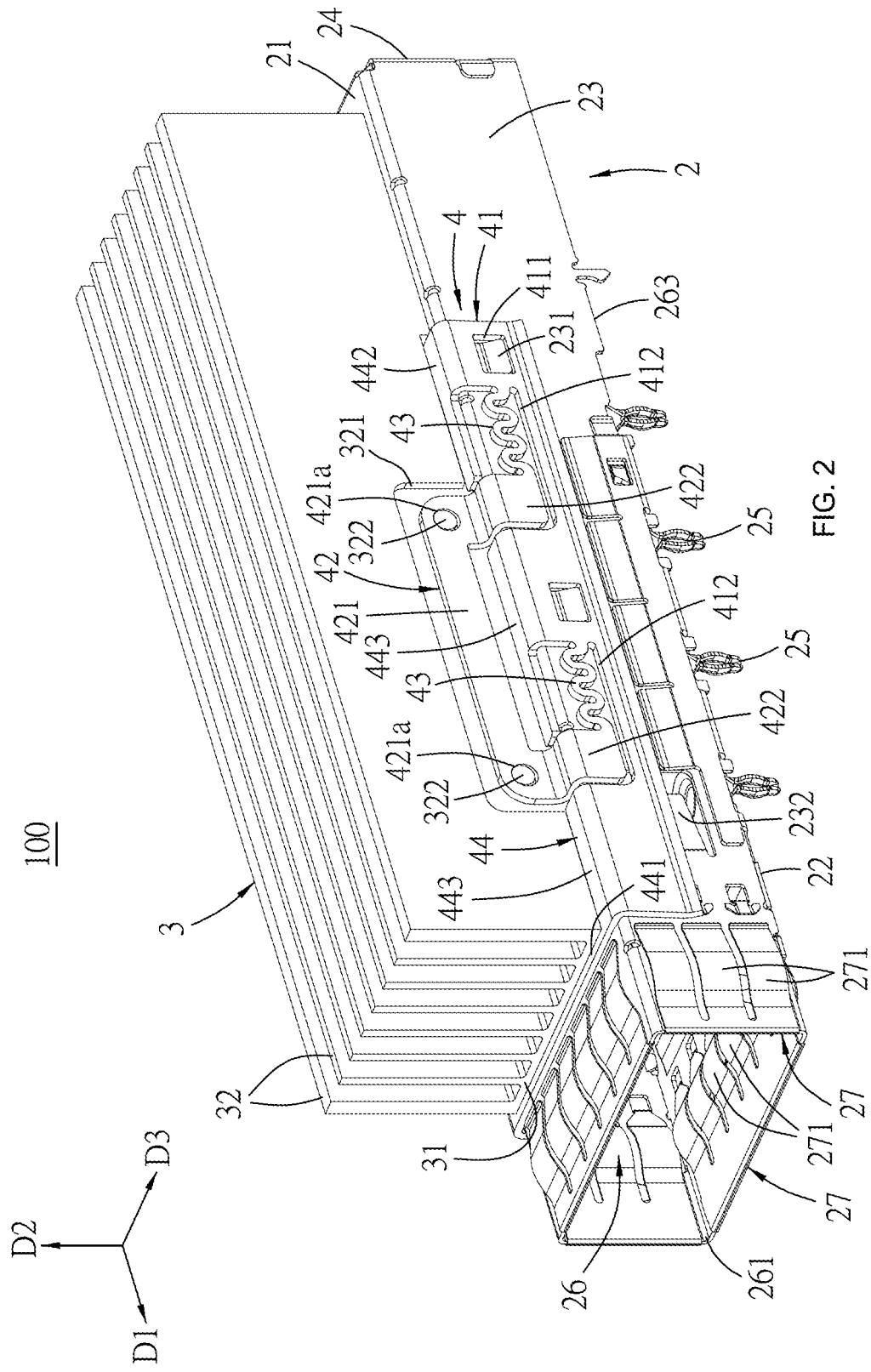
FIG. 2 is a perspective view of the embodiment with a receptacle connector of the embodiment removed.
Figure 3:
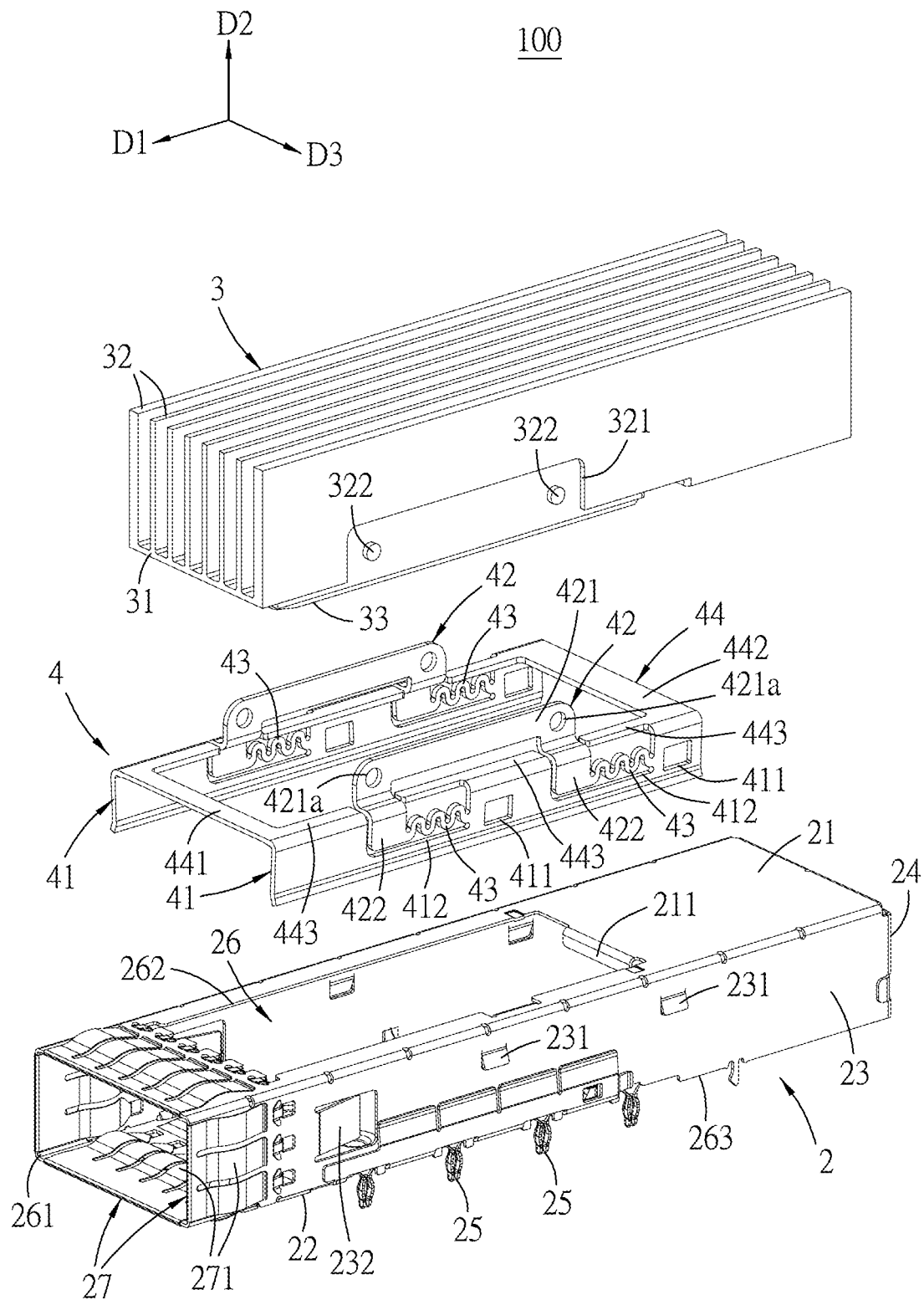
FIG. 3 is a perspective exploded view of FIG. 2.
Figure 4:
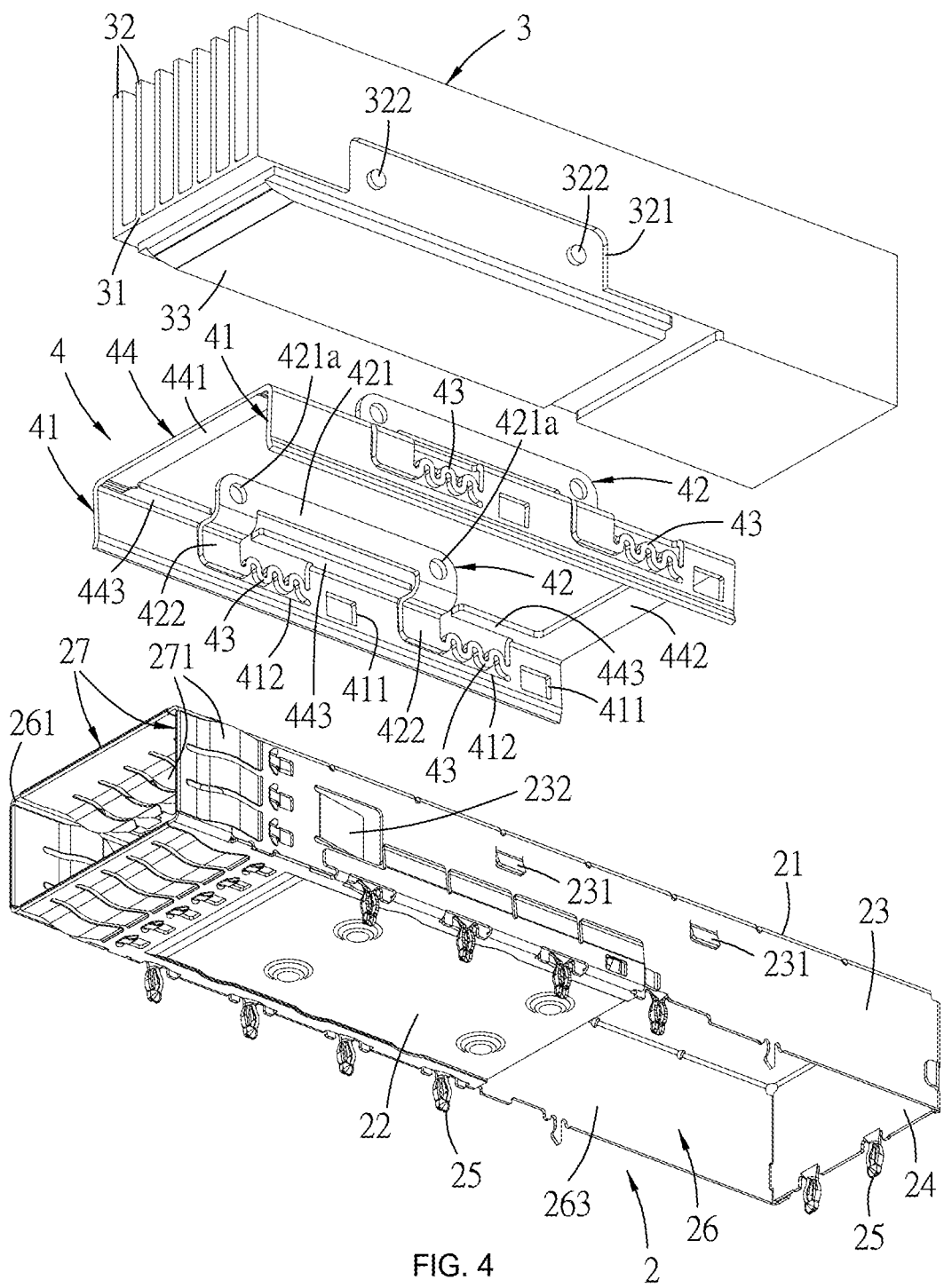
FIG. 4 is a perspective exploded view of FIG. 3 from another angle.

Referring to FIG. 1 through FIG. 4, an embodiment of connector assembly 100 of the present disclosure is adapted to mate with a pluggable module 200. The pluggable module 200 includes a shell 201, a mating board 202 and a cable 203. The shell 201 includes an inserting portion 201a, the mating board 202 is provided to a tip of the inserting portion 201a, and the mating board 202 has contact fingers 202a thereon, the cable 203 is provided to the shell 201 and mechanically and electrically connected to the mating board 202. The connector assembly 100 includes a receptacle connector 1, a shielding cage 2, a heat sink 3 and a clip 4. It is noted that, the receptacle connector 1, the shielding cage 2, the heat sink 3 and the clip 4 may be adjusted respectively in number as desired and may be in a stacked or combined configuration, so the present disclosure is not limited to the numbers of the present embodiment.

The receptacle connector 1 is adapted to be mechanically and electrically provided to a board (the board may be a circuit board (not shown) in the embodiment) or is connected to electrical wires (not shown), the receptacle connector 1 has a housing 11 which is insulating and terminals 12, the housing 11 has a mating groove 111, the terminals 12 are provided in the mating groove 111 and tail portions (not shown) of the terminals 12 are electrically and mechanically connected to the circuit board.

The shielding cage 2 may be of a metal material, for example, and covers the receptacle connector 1, the shielding cage 2 extends along a front-rear direction D1 and has a top wall 21, a bottom wall 22, which is spaced apart from the top wall 21 and faces the top wall 21 along an up-down direction D2, two side walls 23 which are spaced apart from each other, face each other along a left-right direction D3 and are respectively connected to two sides of the top wall 21 and the bottom wall 22, a rear wall 24 which is positioned at a rear end and connected to a rear edge of the top wall 21 and rear edges of the two side walls 23, and legs 25 which extend downwardly from the two side walls 23 and are adapted to be fixed on the circuit board and/or connected to a grounding trace. In addition, the shielding cage 2 further has a receiving cavity 26 which is defined by the top wall 21, the bottom wall 22, the two side walls 23 and the rear wall 24 together and positioned inside, an inserting opening 261 which is positioned at a front end, communicated with the receiving cavity 26 and allows the pluggable module 200 to insert, a window 262 which is formed to the top wall 21 and communicated with the receiving cavity 26, and a bottom opening 263 which is positioned behind the bottom wall 22 and communicated with the receiving cavity 26. Specifically, the receptacle connector 1 is provided to a rear segment of the receiving cavity 26 via the bottom opening 263 so as to be covered by the shielding cage 2, but the present disclosure is not limited thereto. After the pluggable module 200 enters into the shielding cage 2 via the inserting opening 261, the mating board 202 at the tip of the inserting portion 201 of the pluggable module 200 can be inserted into mating groove 111 of the receptacle connector 1, so as to allow the contact fingers 202a of the mating board 202 to contact the terminals 12 in the mating groove 111 of the receptacle connector 1, and in turn allow the pluggable module 200 and the receptacle connector 1 of the connector assembly 100 to be mated with each other. Moreover, a plurality of grounding members 27 are provided at the inserting opening 261, the plurality of grounding members 27 have a plurality of elastic fingers 271 which extend rearwardly from the inserting opening 261 and distributed at an outer side of the shielding cage 2 and an inner side of the shielding cage 2, the elastic finger 271 which is positioned at the outer side of the shielding cage 2 is used to contact a case (not shown), the elastic finger 271 which is positioned at the inner side of the shielding cage 2 is used to contact the pluggable module 200.

Figure 5:
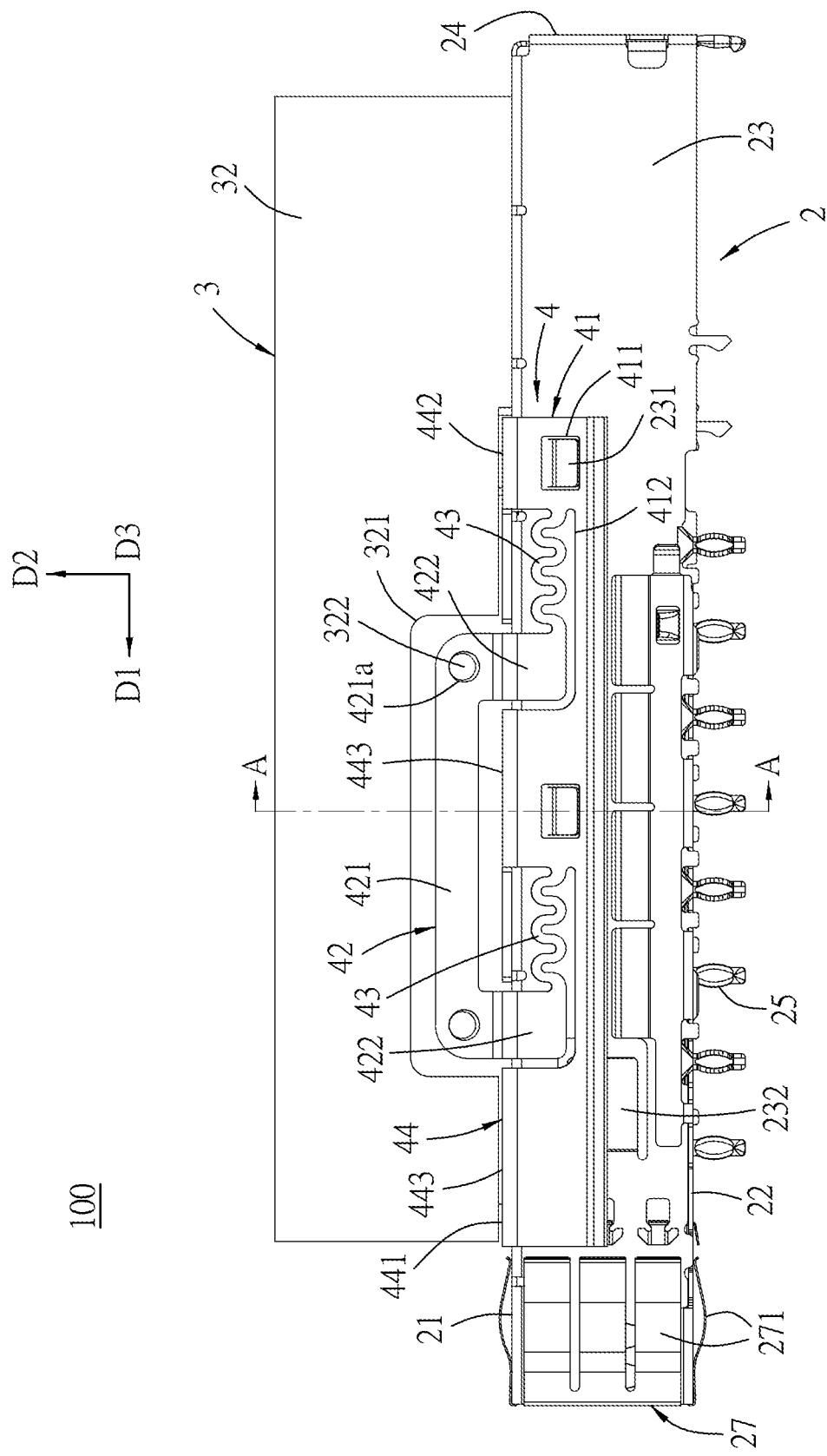
FIG. 5 is a side view of the embodiment with the receptacle connector of the embodiment removed.
Figure 6:
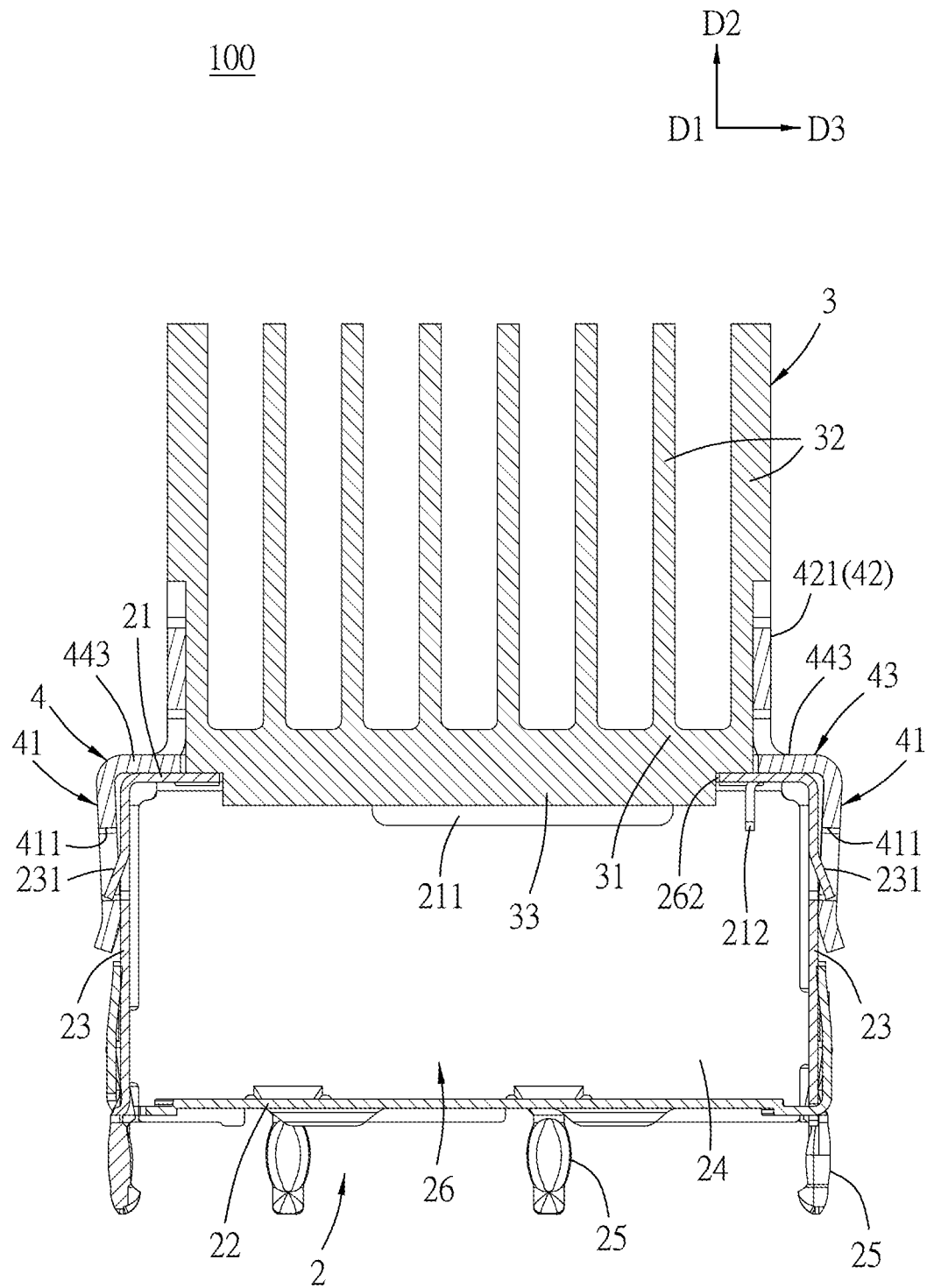
FIG. 6 is a cross sectional view taken along a line A-A of FIG. 5.

Referring to FIG. 1, FIG. 2 and FIG. 4 through FIG. 6, the heat sink 3 includes a heat dissipating base plate 31 which is provided to the top wall 21 of the shielding cage 2, a plurality of heat dissipating fin plates 32 which are integrally formed from the heat dissipating base plate 31 and extend upwardly, and a thermal coupling plate 33 which is provided to a bottom surface of the heat dissipating base plate 31 and positioned at a bottom of the heat sink 3. In the present embodiment, the plurality of heat dissipating fin plates 32 are arranged side by side along the left-right direction D3 and each continuously extend along the front-rear direction D1, but it is noted that, in other embodiments, the plurality of heat dissipating fin plates 32 also may be configured and arranged in other manners, even the plurality of heat dissipating fin plates 32 of the heat sink 3 also may be replaced by heat dissipating fin posts, or may be configured by assembling individual heat dissipating pieces on the heat dissipating base plate 31 by welding, so the present disclosure is not limited to the present embodiment. The thermal coupling plate 33 enters into the shielding cage 2 via the window 262 of the top wall 21 of the shielding cage 2, the pluggable module 200 can directly contact the thermal coupling plate 33 of the heat sink 3 when the pluggable module 200 is inserted into the receiving cavity 26 of the shielding cage 2, thereby assuring heat dissipating efficacy of the heat sink 3.

Referring to FIG. 1 through FIG. 4 and FIG. 6, the clip 4 assembles the heat sink 3 to the top wall 21 of the shielding cage 2 and is provided between the heat sink 3 and the shielding cage 2. The clip 4 is integrally formed by a metal sheet and includes two fixed plates 41, two movable plates 42 and four plate springs 43, two ends of the plate spring 43 are respectively connected to the fixed plate 41 and the movable plate 42, the movable plate 42 is capable of moving relative to the fixed plate 41 by means of the plate spring 43, and each movable plate 42 and one corresponding fixed plate 41 are connected by the two corresponding plate springs 43 arranged along the front-rear direction D1. When the pluggable module 200 is inserted into the receiving cavity 26 of the shielding cage 2, the pluggable module 200 upwardly abuts against a bottom surface of thermal coupling plate 33 of the heat sink 3, the heat sink 3 can be elastically raised upwardly due to spring force of the plate springs 43 of the clip 4, thereby completing contact between the pluggable module 200 and the bottom surface of the thermal coupling plate 33 of the heat sink 3. It may be understood that the number of the fixed plate 41, the number of the movable plate 42 and the number of the plate spring 43 may be adjusted as desired respectively and may be any number, so these numbers are not limited to the numbers in the present embodiment.

The two fixed plates 41 extend along the front-rear direction D1 and are respectively provided to outer side surfaces of the two side walls 23 of the shielding cage 2. Specifically, each side wall 23 is formed with a plurality of latching pieces 231 protruding outwardly, each fixed plate 41 is formed with a plurality of latching holes 411 which are latched and fixed to the plurality of latching pieces 231 of the corresponding side wall 23. The two movable plates 42 are provided to outer side surfaces of the two heat dissipating fin plates 32 positioned a left side and a right side of the plurality of heat dissipating fin plates 32 of the heat sink 3 respectively. Specifically, each movable plate 42 has a heat sink connection portion 421 which extends along the front-rear direction D1 and is elongate and two plate spring connection portions 422 which integrally extend downwardly from two ends of the heat sink connection portion 421 and are respectively connected to the two corresponding plate springs 43, that is to say, the two plate spring connection portions 422 each are connected to one plate spring 43. The two heat dissipating fin plates 32 positioned at the left side and the right side of the plurality of heat dissipating fin plates 32 of the heat sink 3 each have an engagement recess 321 which is formed to an outer side surface of the corresponding heat dissipating fin plate 32 and used to receive and engage with the heat sink connection portion 421 of the corresponding movable plate 42 and fixing posts 322 which are formed to the engagement recess 321 and protrude outwardly, the heat sink connection portion 421 is received in the engagement recess 321 of the corresponding heat dissipating fin plate 32, and the heat sink connection portion 421 is formed with fixing holes 421a which are latched and fixed to the fixing posts 322 of the corresponding heat dissipating fin plate 32. It is noted that, although in the present embodiment, the fixed plate 41 and the movable plate 42 of the clip 4 are respectively provided to the shielding cage 2 and the heat sink 3 all by latching and fixing manner, but in other embodiments, the clip 4 also may be provided to the shielding cage 2 and the heat sink 3 by other engagement manners, for example, riveting or welding and the like. Because, the clip 4 is provided to the heat sink 3 from the left side and the right side of the heat sink 3, it is not necessary for the design to remove the structure at a middle of the heat sink 3 (for example heat dissipating fin plate 32), it can maximally remain the structure at the middle of the heat sink 3 (the heat dissipating fin plate 32), so as to increase heat dissipating area and provide better heat dissipating capability. In the embodiment as shown, the clip 4 may be firstly assembled on the heat sink 3 by the heat sink connection portions 421, and then the clip 4 together with the heat sink 3 can be assembled to the shielding cage 2 together by the fixed plates 41.

In the present embodiment, each fixed plate 41 is formed with two openings 412 which extend downwardly from a top edge of each fixed plate 41 and are spaced apart from each other along the front-rear direction D1, the two plate spring connection portions 422 of the corresponding movable plate 42 respectively extend downwardly into the two openings 412, each plate spring 43 is positioned in the corresponding opening 412, and two ends of each plate spring 43 are respectively connected to the plate spring connection portion 422 of the corresponding movable plate 42 and an inner edge of the opening 412 of the corresponding fixed plate 41. Furthermore, the plate spring 43 is configured by blanking the fixed plate 41, and the plate spring 43 is a plate shape extending along the front-rear direction D1 in a continuous S shape. Because the plate spring 43 used to provide spring force in the clip 4 is configured by blanking the fixed plate 41, the mold design is simpler, dimensional tolerance to be controlled is smaller, and mold dimensional requirement, mold strength requirement and mass production and maintain requirement are also smaller, whole manufacturing cost is lower.

Figure 7:
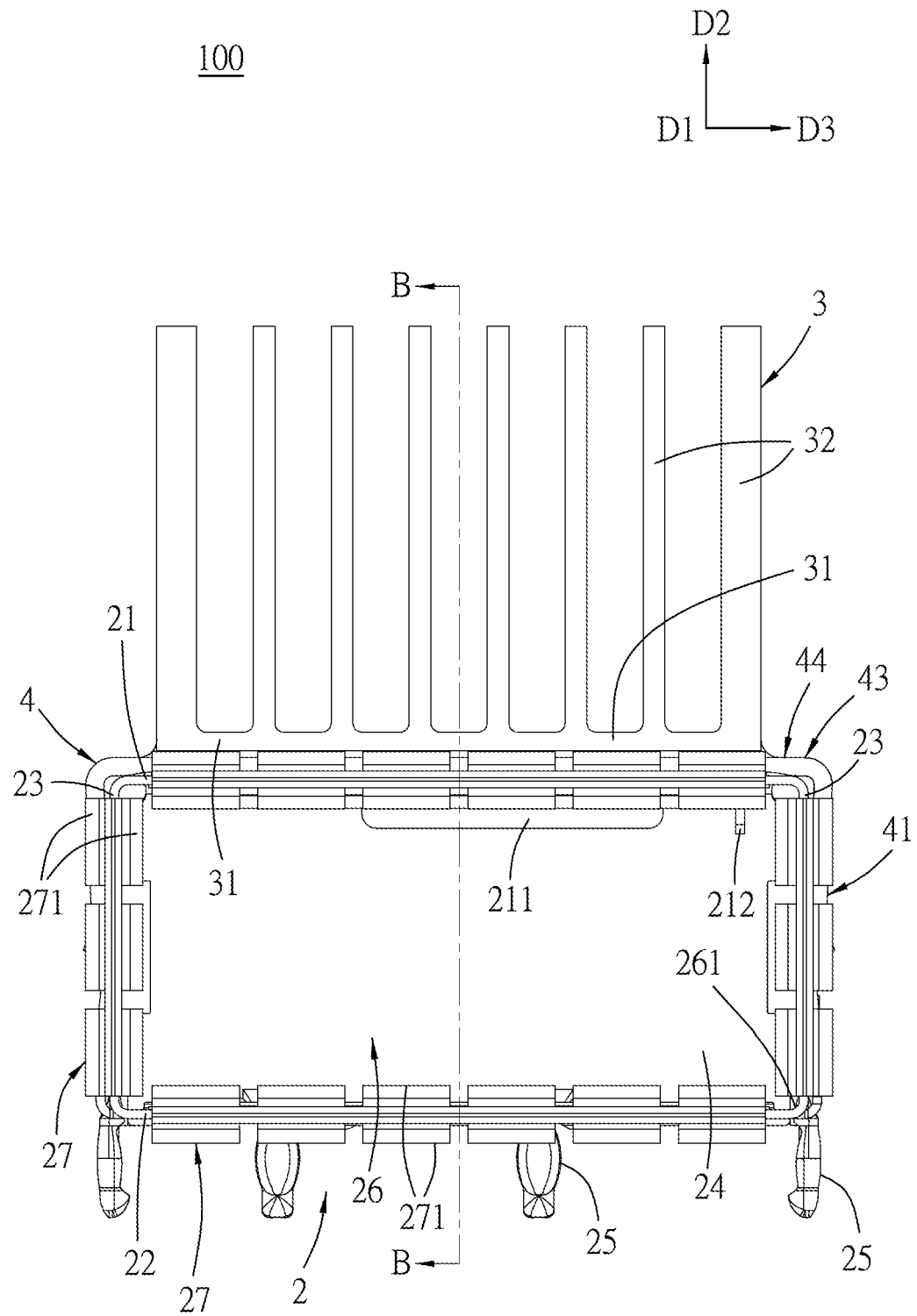
FIG. 7 is a front view of the embodiment with the receptacle connector of the embodiment removed.
Figure 8:
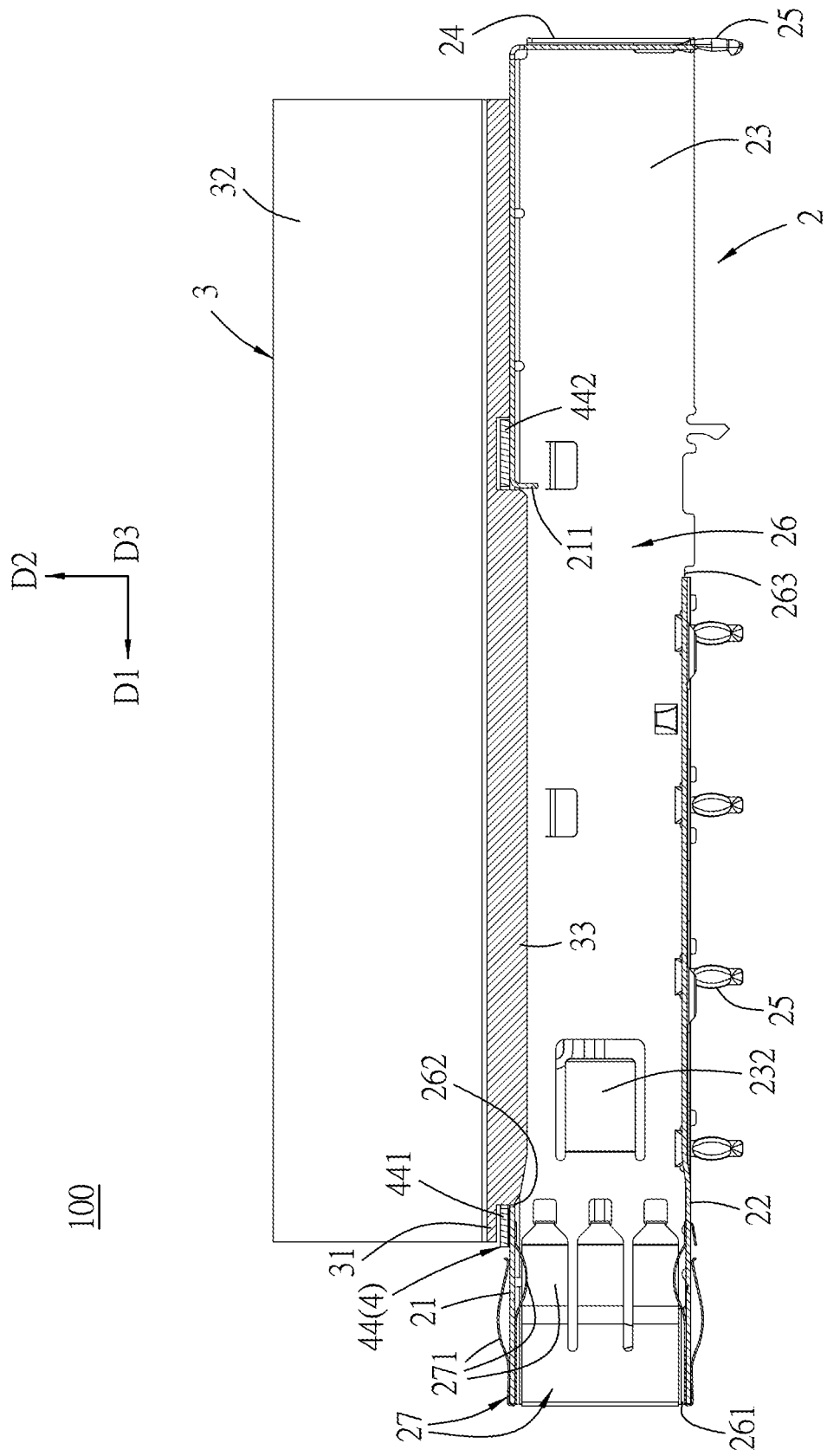
FIG. 8 is a cross sectional view taken along a line B-B of FIG. 7.

Referring to FIG. 2, FIG. 3 and FIG. 6 through FIG. 8, moreover, in the present embodiment, the clip 4 further includes a frame plate 44 which is positioned between the top wall 21 of the shielding cage 2 and the heat dissipating base plate 31 of the heat sink 3 and is positioned around the window 262 of the top wall 21, the frame plate 44 has a front frame 441 and a rear frame 442 which are connected between the two fixed plates 41, spaced apart from each other and arranged along the front-rear direction D1, and side frames 443 which extend respectively from the two fixed plates 41. The front frame 441 and the rear frame 442 are respectively positioned at two ends of the window 262 of the top wall 21 in the front-rear direction D1, the side frames 443 are respectively positioned at a left side and a right side of the window 262 of the top wall 21. The frame plate 44 of the clip 4 can block a gap generated between the shielding cage 2 and the heat sink 3 when the heat sink 3 is raised, thereby increasing shielding effect.

Referring to FIG. 1, FIG. 3 and FIG. 6 through FIG. 8, in addition, in the present embodiment, the top wall 21 of the shielding cage 2 has a stopping piece 211 which is formed at a rear edge of the window 262 and bent downwardly and an aligning piece 212 which is formed at a rear segment of a side edge of the window 262 and bent downwardly. The inserting portion 201a of the pluggable module 200 further has a stopping face 201b which corresponds to the stopping piece 211 and an aligning groove 201c which corresponds to the aligning piece 212. When the pluggable module 200 enters into the shielding cage 2 and mates with the receptacle connector 1 of the connector assembly 100, the stopping piece 211 stops the stopping face 201b and the aligning piece 212 is received in the aligning groove 201c, so the pluggable module 200 and the connector assembly 100 are positioned relative to each other. Moreover, each side wall 23 of the shielding cage 2 further has a locking piece 232 extending inwardly, the inserting portion 201a further has two locking recesses 201d which are formed to two side surfaces of the inserting portion 201a respectively and respectively correspond to the two locking pieces 232 of the two side walls 23, when the pluggable module 200 and the connector assembly 100 are mated with each other, the two locking pieces 232 are latched to the two locking recesses 201d respectively, so as to lock the pluggable module 200 and the connector assembly 100 with each other. And the shell 201 of the pluggable module 200 is further provided with an unlocking member 204 which extends from a rear end of the shell 201 (away from the connector assembly 100) along a left side and a right side of the shell 201 to the two locking recesses 201d, the unlocking member 204 has a pull ring 204a which is positioned at a rear end of the unlocking member 204 and two unlocking portions 204b which are respectively positioned in front of the two locking recesses 201d respectively, when the pluggable module 200 and the connector assembly 100 are locked with each other, a user may pull the pull ring 204 rearwardly (away from the connector assembly 100), to bring the two unlocking portion 204b to move rearwardly and allow the two unlocking portion 204b to push the two locking pieces 232 outwardly respectively and make the two locking pieces 232 disengaged with the two locking recesses 201d respectively, in turn the pluggable module 200 and the connector assembly 100 are unlocked.

In conclusion, the clip 4 of the connector assembly 100 of the present disclosure is provided to the heat sink 3 from the left side and the right side of the heat sink 3, it is not necessary for the design to remove the structure at the middle of the heat sink 3 (for example heat dissipating fin plate 32), it can maximally remain the structure at the middle of the heat sink 3 (the heat dissipating fin plate 32), so as to increase heat dissipating area and provide better heat dissipating capability. In addition, the plate spring 43 of the clip 4 is configured by blanking the fixed plate 41, so the mold design is simpler, dimensional tolerance to be controlled is smaller, and mold dimensional requirement, mold strength requirement and mass production and maintain requirement are also smaller, whole manufacturing cost is lower. The frame plate 44 of the clip 4 can block a gap generated between the shielding cage 2 and the heat sink 3 when the heat sink 3 is raised, thereby increasing shielding effect.

However, what is described above is just the embodiments of the present disclosure, which is not intended to limit the scope implementing the present disclosure, any simple equivalent variations and modifications made according to the claims and the specification of the present disclosure will also be fallen within the scope of the present disclosure.

What is claimed is:

1. A connector assembly, comprising:
a receptacle connector;
a shielding cage covering the receptacle connector;
a heat sink; and
a clip configured for assembling the heat sink to the shielding cage, the clip being integrally formed by a metal sheet and comprising a fixed plate, a movable plate and a plate spring, the fixed plate being provided to the shielding cage, the movable plate being provided to a side surface of the heat sink, two ends of the plate spring being respectively connected to the fixed plate and the movable plate, the movable plate being configured to move relative to the fixed plate by means of the plate spring.

2. The connector assembly as recited in claim 1, wherein the clip integrally comprises two fixed plates and two movable plates,
each movable plate and one corresponding fixed plate are connected by the plate spring,
the two fixed plates are respectively provided to two side surfaces of the shielding cage, the two movable plates are respectively provided to two side surfaces of the heat sink.

3. The connector assembly as recited in claim 1, wherein the movable plate has a heat sink connection portion and a plate spring connection portion, the fixed plate is formed with an opening, the plate spring connection portion extends into the opening, the plate spring is positioned in the opening, and the two ends of the plate spring are respectively connected to the plate spring connection portion of the movable plate and an inner edge of the opening of the fixed plate.

4. The connector assembly as recited in claim 3, wherein each movable plate has two plate spring connection portions integrally extending from two ends of the heat sink connection portion, the two plate spring connection portions each are connected to the plate spring.

5. The connector assembly as recited in claim 4, wherein the plate spring is configured by blanking the fixed plate, and the plate spring has a continuous S shape.

6. The connector assembly as recited in claim 1, wherein the shielding cage has a top wall which is formed with a window,
the heat sink comprises a heat dissipating base plate and a thermal coupling plate which is provided to a bottom surface of the heat dissipating base plate and is positioned at a bottom of the heat sink, the thermal coupling plate is configured to enter into the shielding cage via the window of the top wall of the shielding cage,
the clip further comprises a frame plate which is positioned between the top wall of the shielding cage and the heat dissipating base plate and is positioned around the window of the top wall.

7. The connector assembly as recited in claim 6, wherein the clip comprises two fixed plates, the two fixed plates are respectively provided to two side surfaces of the shielding cage,
the frame plate has a front frame and a rear frame which are connected between the two fixed plates and side frames, which extend respectively from the two fixed plates.

8. The connector assembly as recited in claim 2, wherein the heat sink comprises a plurality of heat dissipating fin plates which are arranged side by side in a left-right direction and each continuously extends in a front-rear direction,
the two movable plates of the clip are provided to outer side surfaces of the plurality of heat dissipating fin plates which are positioned at a left side and a right side of the plurality of heat dissipating fin plates.

* * * * *